United States Patent
Bertin et al.

(10) Patent No.: US 6,633,055 B2
(45) Date of Patent: *Oct. 14, 2003

(54) ELECTRONIC FUSE STRUCTURE AND METHOD OF MANUFACTURING

(75) Inventors: Claude L. Bertin, South Burlington, VT (US); Erik L. Hedberg, Essex Junction, VT (US); Max G. Levy, Essex Junction, VT (US); Timothy D. Sullivan, Underhill, VT (US); William R. Tonti, Essex Junction, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/303,509

(22) Filed: Apr. 30, 1999

(65) Prior Publication Data

US 2002/0011645 A1 Jan. 31, 2002

(51) Int. Cl.$^7$ .................. H01L 29/74; H01L 29/00; H01L 23/495; H01L 23/62; H01L 23/58
(52) U.S. Cl. .................. 257/173; 257/529; 257/665; 257/666; 257/667
(58) Field of Search .................. 257/173, 529, 257/665, 666, 667, 910; 438/601, 619, 625; 216/16, 75; 29/623

(56) References Cited

U.S. PATENT DOCUMENTS 4,089,734 A 5/1978 Bierig (List continued on next page.)

OTHER PUBLICATIONS

NAoyuki SHimomura et al., "COmpact Pulsed Power Generator by an Inductive Energy Storage Sysytem with Tw0–staged Opening Switches", IEEE TRansactions on Plasma Science, vol. 19, No.6, Dec. 1991.*

G.K. Feeder et al. <"Thermal Assembly of Polysilicon Microactuators with Narrow–Gap Electrostatic Comb Drive" IEEE, 1992 pp. 63–68.*

Nobvuaki Ueki et al., Single–Transverse_MOde 3.4–mW Emission of Oxide–confirmed 780–nm VCSEL's. IEEE Photonics Technology Letters, vol. 11, No.12, Dec. 1999.*

*Primary Examiner*—Wael Fahmy
*Assistant Examiner*—Shrinivas H. Rao
(74) *Attorney, Agent, or Firm*—Scully, Scott, Murphy & Presser; Anthony J. Canale (57) ABSTRACT

A gap conductor structure for an integrated electronic circuit that may function as an electronic fuse device or as a low capacitance inter level signal line is integrated as part of the semi-conductor chip wiring. The gap conducting structure includes one or more air gap regions of predefined volume that fully or partially exposes a length of interlevel conductor layer in an IC. Alternately, the air gap region may wholly located within the dielectric region below a corresponding conductor and separated by insulator. When functioning as a fuse, the gap region acts to reduce thermal conductivity away from the exposed portion of the conductor enabling generation of higher heat currents in the conducting line with lower applied voltages sufficient to melt a part of the conducting line. The presence of gaps, and hence, the fuses, are scalable and may be tailored to the capacity of currents they must carry with the characteristics of the fuses defined by a circuit designer. Furthermore, conducting structures completely or partially exposed in the air gap may function as low capacitance minimum delay transmission lines.

8 Claims, 7 Drawing Sheets

U.S. PATENT DOCUMENTS

| | | |
|---|---|---|
| 4,272,753 A | 6/1981 | Nicolay |
| 4,503,315 A | 3/1985 | Kamioka et al. |
| 4,547,830 A | 10/1985 | Yamauchi |
| 4,774,561 A | 9/1988 | Takagi |
| 4,792,835 A | 12/1988 | Sacarisen et al. |
| 4,879,587 A | 11/1989 | Jerman |
| 4,890,380 A * | 1/1990 | Narancic et al. ............... 29/623 |
| 5,041,897 A | 8/1991 | Machida et al. |
| 5,196,819 A | 3/1993 | Roberts |
| 5,420,456 A | 5/1995 | Galbi et al. |
| 5,446,436 A | 8/1995 | Williams |
| 5,521,116 A | 5/1996 | Boku |
| 5,602,053 A | 2/1997 | Zheng et al. |
| 5,608,257 A | 3/1997 | Lee et al. |
| 5,650,355 A | 7/1997 | Fukuhara et al. |
| 5,723,898 A | 3/1998 | Gilmour et al. |
| 5,747,868 A | 5/1998 | Reddy et al. |
| 5,759,497 A * | 6/1998 | Kuzumoto et al. .... 422/186.07 |
| 5,844,464 A * | 12/1998 | Kalapodis et al. .......... 337/140 |
| 5,939,020 A * | 8/1999 | Glaunsinger et al. ......... 422/53 |

* cited by examiner

ELECTRONIC FUSE STRUCTURE AND METHOD OF MANUFACTURING

BACKGROUND OF THE INVENTION

1. Field of the Invention

The present invention relates generally to electronic fuse structures provided in integrated circuits, and particularly, a system and method for fabricating scalable electronic fuse structures employed for fixing configuration of IC circuit components and enhancing IC circuit performance.

2. Discussion of the Prior Art

Currently, metal fuses may be fabricated in integrated circuits for a variety of reasons, including protection from ESD during manufacture and handling during burn-in or prior to packaging, removing or disconnecting defective components from a circuit, or, for generating initial values of stored data, e.g., in an IC ROM.

U.S. Pat. No. 4,272,753 discusses a method for fabricating a discrete metallic fuse device using fusable material which is necked to a narrow region. The fusable material is separated from an insulative layer by an air gap which provides lower thermal conductivity environment.

U.S. Pat. No. 4,089,734 discusses a metallic fuse device for read only memory and memory reconfiguration applications which involves a complicated technique including a four layer deposition of metallizations, requires the etching at two sides of a fusable link layer to form the resultant fusable link, and etching of the silicon substrate material to form a mesa structure.

U.S. Pat. No. 4,879,587 discusses manufacture of a metallic fuse device that is provided on top of a supporting insulating bridge structure for connecting two conductive regions.

The manufacture of each of these fuse devices in the prior art is generally complicated requiring many processing steps.

It is thus highly desirable to provide a system and method for manufacturing a scalable electronic fuse structure in an integrated circuit, and particularly, that may function at any level of wiring, in a minimum of process steps. Such a novel fuse structure for an integrated circuit may be scaled, i.e., tailored to fix configuration of IC circuit components.

It would additionally be highly desirable to provide a system and method for manufacturing a high-performance conducting line comprising a gap conductor, i.e., a conductor partially or completely exposed in an air-gap region, which is designed to enhance IC circuit performance by providing lower capacitive conducting line loading.

SUMMARY OF THE INVENTION

It is an object of the present invention to provide a scalable electronic fuse structure in integrated circuits and a method for manufacturing thereof that comprises a gap conductor, i.e., a conductor partially or completely exposed in an air-gap region, with the minimum of process steps.

It is a further object of the present invention to provide a novel high-performance signal line structure in integrated circuits and a method for manufacture thereof that is designed and tailored to minimize inter level signal capacitive loading.

The present invention solves the problem of removing an inter level dielectric selective to an overpassing conductor, and leaving an air gap between the conductor and the structure below, in a minimum of process steps. Thus, the present invention provides a solution to two known problems: 1) the minimization of inter level signal wiring capacitance with a material that has a low dielectric constant, e.g., an air gap; and, 2) locally minimizing the thermal conduction path below a conductor to the silicon substrate. The general method used to remove the underlying dielectric of an overpassing metal conducting line, e.g., aluminum or copper line, is to add one blockout mask to the process used to etch the region under the conductor.

Particularly, the method for manufacturing an electronic fuse device for an integrated circuit comprises the steps of: providing a semiconductor substrate having at least an interlevel dielectric layer formed thereon; forming an underfill layer of material in the interlevel dielectric layer above the substrate at a location corresponding to a location of an overpassing conducting line; forming a metal conductor on top of the underfill layer, so that the underfill layer has a width greater than a width of the conductor; providing additional interlevel insulating dielectric material over the conductor; forming a via structure extending through the interlevel insulating dielectric and extending to a portion of the underfill layer extending past the conductor; and, through the via, etching the underfill layer to form a resultant air gap formed within the interlevel dielectric, wherein the conductor is partially exposed in the air gap between the substrate.

Advantageously, the employment of the novel electronic fuse structure according to the invention enables employment of BEOL wiring for electronic fuses. Furthermore, the electronic fuse structure may be scaled to dimensions smaller than that of a laser beam, which are currently used to blow conventional large and cumbersome electronic laser fuses.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENTS OF THE INVENTION

The present invention is a novel electronic fuse structure for integrated circuits and a method for manufacturing thereof that comprises a "gap conductor," i.e., a length of a metal conductor in an integrated circuit that is surrounded below and/or above by an interlevel air bridge or gap region. As will be referred to herein, the term "underfill" is defined as a sacrificial interlevel oxide layer to be removed under the gap conductor between the gap conductor and the underlying substrate; and, "overfill" is the sacrificial interlevel oxide layer to be removed above the gap-conductor structure. Such a gap-conductor may be designed for implementation as an integrated circuit electronic fuse, or, may be designed to function as a high-performance conductor, e.g., in high-frequency electronic circuit applications, as an air bridge provides the means for the lowest dielectric constant possible.

Figure 1A:
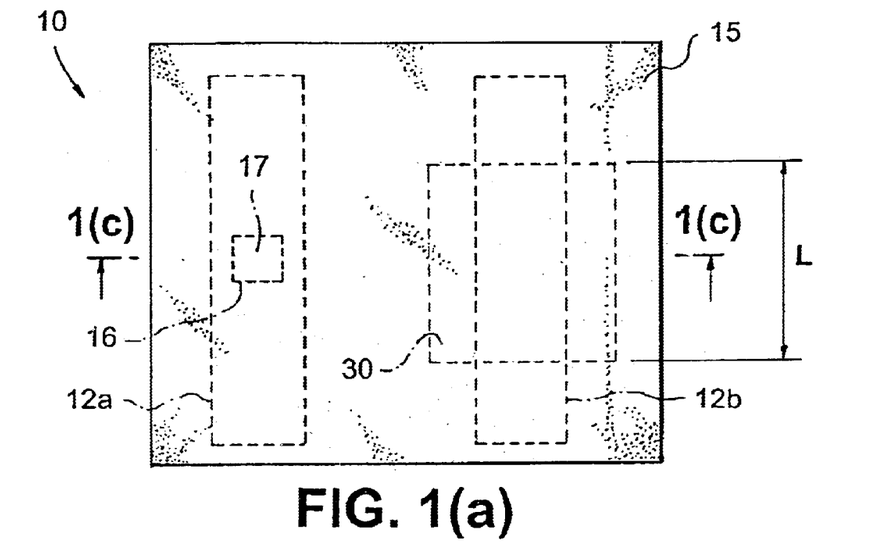
FIGS. 1(a)–1(c) illustrate the method according to a first embodiment for producing an electronic fuse structure having an air gap below an inter-level conducting layer.
Figure 1B:
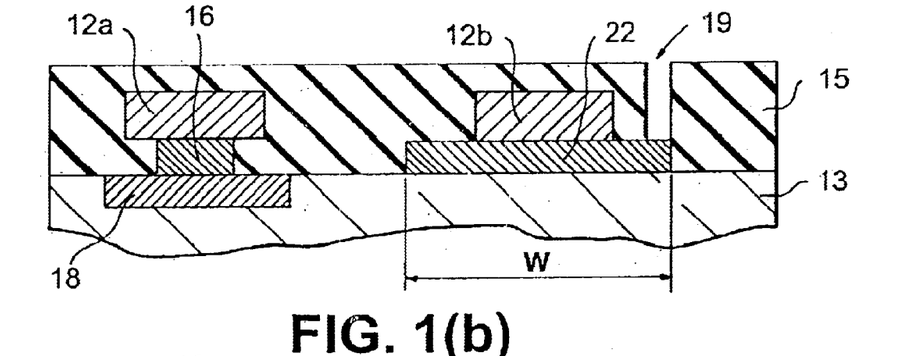
Figure 1C:
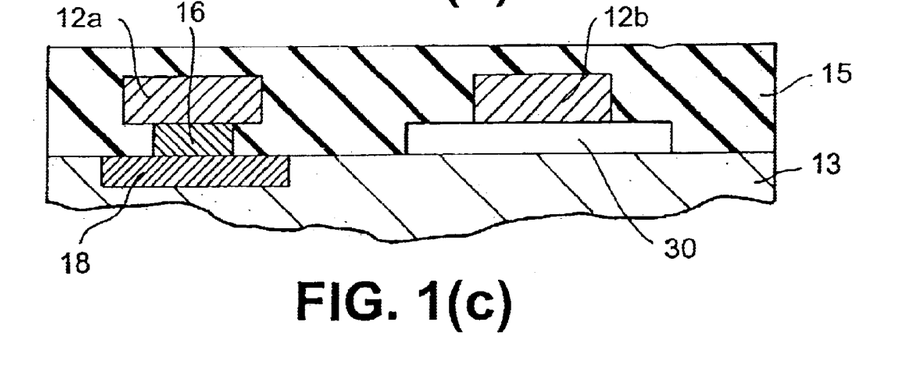

The structure and method of the invention according to a first embodiment is shown and described with respect to FIGS. 1(a)–1(c). In this first embodiment, a process is implemented to provide an air gap below a gap-conductor. FIG. 1(a) illustrates a top view of a resultant fuse structure 10 including two conductors 12a, 12b with 12b being a gap conductor having a gap 30 formed along a portion of its length thereunder. Insulative interlayer material 15 is shown surrounding each of the conductors and the gap and may comprise the following types of interlevel dielectric material $SiO_2$, NO, ONO, $Al_2O_3$, oxides of Ta, etc. As shown in FIG. 1(b), insulative layer 15 is formed atop substrate 13 and metal studs 16 and 22 are manufactured through the insulative 25 layer 15. In a subsequent metallization step, the respective metal conductors 12a,b are formed respectively along a portion of the insulator 15 so as to contact the metal studs 16 and 22, and the insulator is extended to surround the conductors. As shown in FIG. 1(b), the stud 16 may function as a metal contact 17 connecting the conductor 12a to an underlying conducting layer 18, for example, and is of a typical composition material, e.g., Ti/TiN liner filled with Tungsten, such as used in 64-1 Gb DRAM processing. Other conductors, such as Al, Al-Cu, Cu, polysilicon or polysilicides may be used. In the formation of the gap under conductor 12b, as shown in FIG. 1(b), the process requires the formation an enlarged stud portion 22 which functions as the sacrificial gap-conductor underfill and preferably is formed of Tungsten, or optionally, a Ti/TiN liner filled with Tungsten. Preferably, the underfill region 22 is designed to have a width "W" overextending the width of the conductor 12b, for example, between 1–3 times the width of the conductor thereover, and as shown in FIG. 1(a), has a pre-defined length "L" which is a design choice dictated according to the particular function of the structure, for example, fuse or low-capacitive conductor. Since this is implemented in a present processing sequence, no additional cost has been added at this point.

FIG. 1(b) further depicts the next step of the process which requires implementation of a block mask to open a via 19 that is etched through the top insulative material layer 15 to the gap-conductor underfill layer (stud) 22. The via 19 may be vertical, such as shown in FIG. 1(b), or may be tapered. In a next step, the underfill 22 is then etched using either a chlorine or peroxide solution. Chlorine preferentially removes the Tungsten, leaving the Ti/TiN liner in place, while peroxide removes both the Tungsten and the Ti/TiN liner. Both etches are selective to the gap-conductor metal (e.g., Al or Cu). The etched out underfill results in the air gap or cavity 30 which separates that portion of conductor 12b from the underlying substrate 13.

Figure 8:
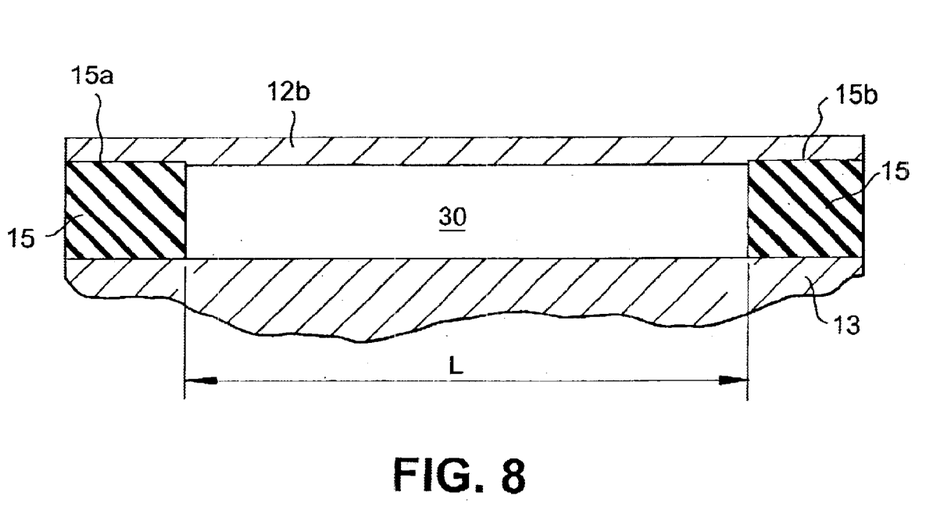
FIG. 8 is a cross sectional view of a length of inter-level conductor having an air gap underfill of length L.

Finally, in an oxide deposition process, the via 19 is filled with insulator and the structure is planarized to result in a gap-conducting fuse structure as shown in FIG. 1(c). It should be understood that, depending upon the process, the maximum thickness of oxide that may be deposited within the cavity is equal to or less than one-half (½) the width of the hole. Thus, depending upon the speed of oxide deposition, and given that the cavity (gap) is much larger than the hole, the hole 19 fills up and be pinched off before much material gets deposited in the cavity (gap). FIG. 8 depicts a side view of a resultant semiconductor fuse structure 10 showing a length of inter-level conductor having an air gap thereunder of length L. As shown in the cross section of FIG. 8, it should be understood that the portion of the conductor 12b itself is supported by interlevel dielectric 15 at opposite ends 15a, 15b of a formed gap 30 regardless of whether the gap completely surrounds or is formed only underneath the conductor.

Figure 2A:
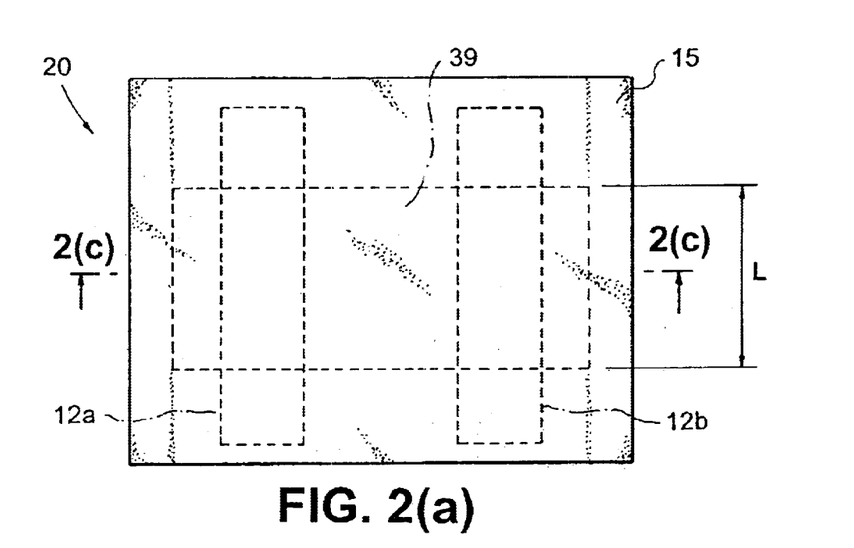
FIGS. 2(a)–2(c) illustrate the method according to a first embodiment for producing an electronic fuse structures having an air gap below one or more parallel located inter-level conducting layers.
Figure 2B:
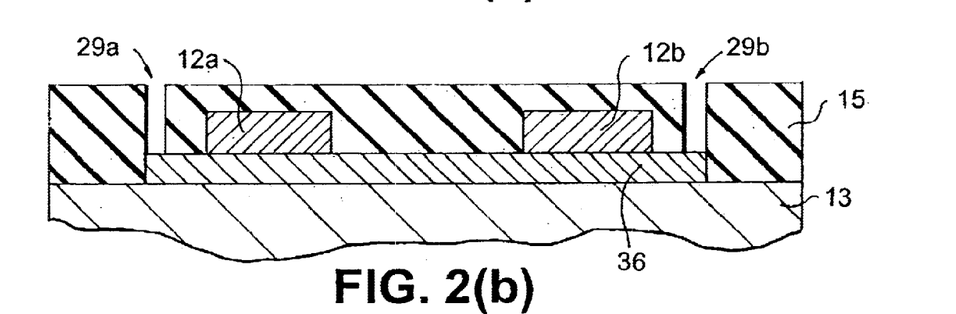

Further according to the principles described herein with respect the first embodiment of the invention, a process is implemented to provide an air gap below two or more interlevel conductors. FIG. 2(a) illustrates a top view of a resultant fuse structure 20 including two conductors 12a, 12b each of which is a gap conductor having a gap 40 formed thereunder. Insulative material 15 is shown surrounding each of the conductors and the gap. As shown in FIGS. 2(a) and 2(b), an enlarged stud 36 of a typical composition material such as Ti/TiN liner filled with Tungsten, such as used in 64-1 Gb DRAM processing, is formed atop the insulative substrate 15, with each of the conductors 12a,b formed thereon in a subsequent processing step. An insulative layer 15 is then formed atop the conductive and underfill (stud) layer in a subsequent step. The enlarged stud 36 is to be used as a sacrificial gap-conductor underfill, with the underfill region 36 preferably designed to have a width "W" overextending the width of each conductor 12a,b thereover. As shown in FIG. 2(a), the underfill region 36 has a pre-defined length "L" which is less than the length of the corresponding conductors thereover. Since this is a present processing sequence, no additional cost has been added at this point.

FIG. 2(b) further depicts the next step of the process which requires implementation of a block mask to open two vias 29a and 29b that are etched through the top insulative material layer 15 to the gap-conductor underfill 36 along one outer side of a respective conductor 12a,b. Preferably, each via 29a,b is vertical, such as shown in FIG. 2(b), or may be tapered. The whole underfill layer 36 is then etched using either a chlorine or peroxide solution with the etches selective to the gap-conductor metal (e.g., Al or Cu). The etched out underfill results in the air gap 39 which separates a portion of each of the conductors 12a,b from the underlying substrate 13. The sacrificial underfill region may also be an insulator (SiN, for example), polysilicon, etc., and are not confined to metal.

Figure 2C:
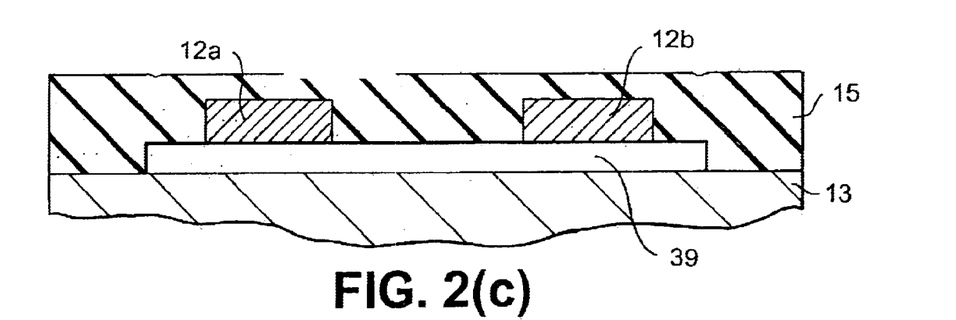

Finally, in an oxide deposition process, the vias 29a,b are filled with insulator and the structure is planarized to result in a gap-conducting structure having gaps underneath both conductors 12a,b as shown in FIG. 2(c).

Figure 3A:
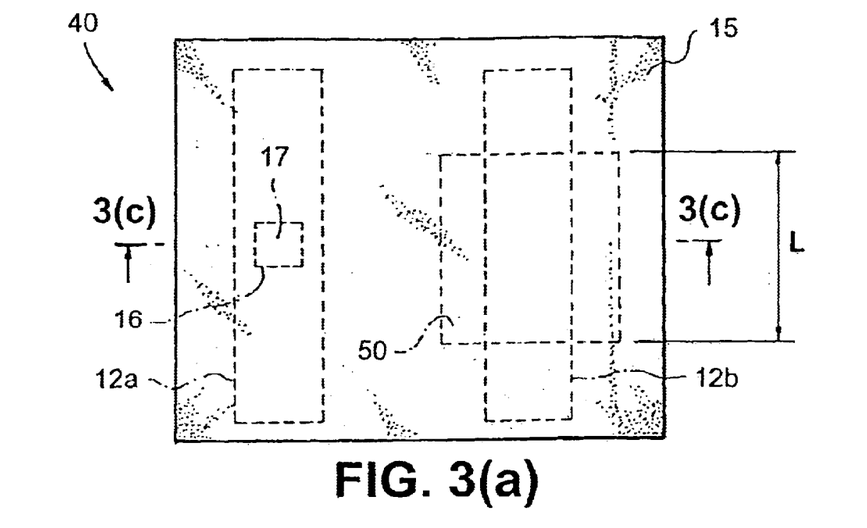
FIGS. 3(a)–3(c) illustrate the method according to a second embodiment for producing an electronic fuse structure having an air gap above and below an inter-level conducting layer.
Figure 3B:
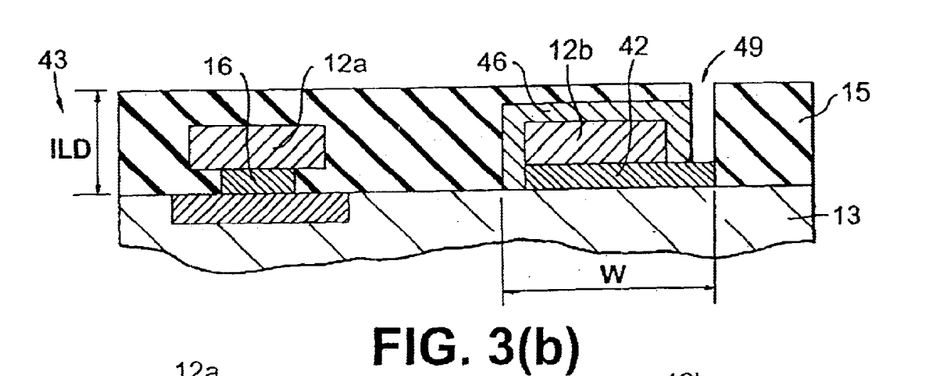
Figure 3C:
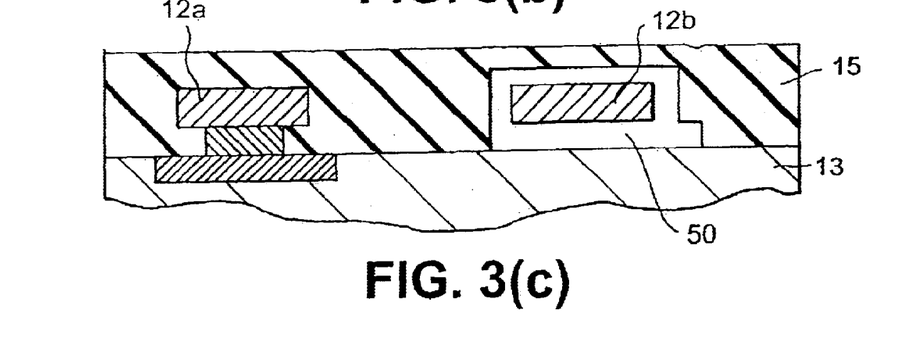

The invention according to a second embodiment is shown and described with respect to FIGS. 3(a)–3(c). In this second embodiment, a process is implemented to provide an air gap that surrounds a gap-conductor. FIG. 3(a) illustrates a top view of a resultant fuse structure 40 including two conductors 12a, 12b with a portion of conductor 12b being a gap conductor completely surrounded by an air-gap cavity 50. As shown in FIGS. 3(a) and 3(b), in a first step, the underfill layer studs 16 and 42 are first provided through insulative layer 15, as described above with respect to FIGS. 1(a) and 1(b), and, in a metallization step (Al or Cu), the respective conducting metal layers 12a,b are formed thereon. An overfill layer 46 is then formed to surround the conductor 12b. Preferably, both the underfill and overfill layers are designed to have a width "W" overextending the width of the conductor 12b thereover, and as shown in FIG. 1(a), has a pre-defined length "L" which is less than the length of the corresponding conductor thereover. The overfill layer 46 as shown in FIG. 3(b) is a masked deposition of the interconnect material, and adds additional cost to the process. It should be understood that the overfill 46 is applied to the gap conductor 12b in a manner so as to maintain planarity with the next level of wiring. It should be understood that an additional interlevel dielectric (ILD) layer 43 is deposited to maintain the vertical structure ground rules for a future interconnect. Next, as depicted in FIG. 3(b), a block mask is used to open a via 49 etched to the gap-conductor underfill 42 and overfill 46. The via 49 is vertical, or may be tapered. The underfill 42 and overfill 46 is then etched using either a chlorine or peroxide solution which etch is selective to the gap-conductor material (e.g., Al and/or Cu). The result of etching away the underfill and overfill results in air gap 50 formed surrounding the portion of conductor 12b.

Figure 4A:
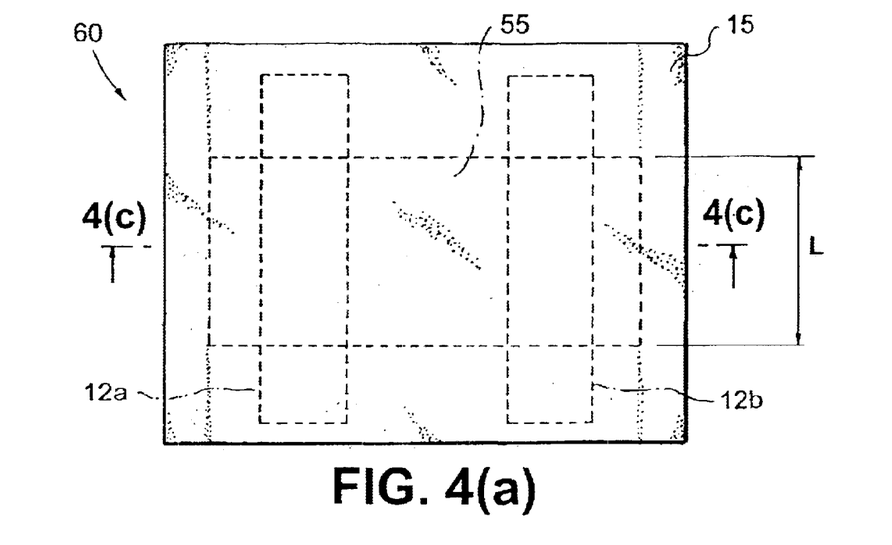
FIGS. 4(a)–4(c) illustrate the method according to a second embodiment for producing an electronic fuse structures having an air gap above and below each of one or more parallel located inter-level conducting layers.

Finally, the via 49 is filled with insulator and the structure is planarized to result in a gap-conducting structure having gaps on all sides of the conductor 12b as shown in FIG. 3(c). Further according to the principles described herein with respect to the second embodiment of the invention, a process is implemented to provide an air gap above and below two or more interlevel conductors. FIG. 4(a) illustrates a top view of a resultant fuse structure 60 including two conductors 12a, 12b each of which is a gap conductor having a gap region 55 formed thereabout. Preferably, both the underfill and overfill layers are designed to occupy a width "W" overextending the width of each conductor 12a,b, as shown in FIG. 1(a), and has a pre-defined length "L" which is less than the length of the corresponding conductor.

Figure 4B:
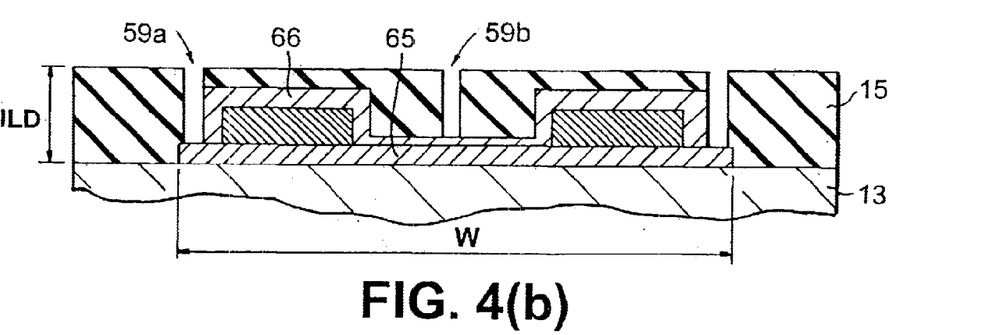

As shown in FIG. 4(b), an underfill layer stud 65 of width W and length L is first provided, as described above with respect to FIGS. 2(a) and 1(b), and, in a metallization step (Al or Cu), the respective conducting metal layers 12a,b are formed thereon. An overfill layer 66 is then formed atop each conductor 12a,b. The overfill layer 66 is a masked deposition of the interconnect material, and adds additional cost to the process as shown in FIG. 4(b). It should be understood that the overfill 66 is applied to the gap conductors 12a,b in a manner so as to maintain planarity with the next level of wiring. An additional interlevel dielectric (ILD) layer is additionally deposited to maintain the vertical structure ground rules for a future interconnect. Next, as depicted in FIG. 4(b), a block mask is used to open a vias 59a, 59c etched to the gap-conductor underfill 65 and a via 59b etched to the gap-conductor overfill 66. The vias 59a,b,c are preferably vertical, or may have an inverted taper. The underfill 65 and overfill 66 are then etched using either a chlorine or peroxide solution which etch is selective to the gap-conductor material (e.g., Al and/or Cu). The result of etching away the underfill and overfill results in air gap 55 formed surrounding each conductor 12a,b.

Figure 4C:
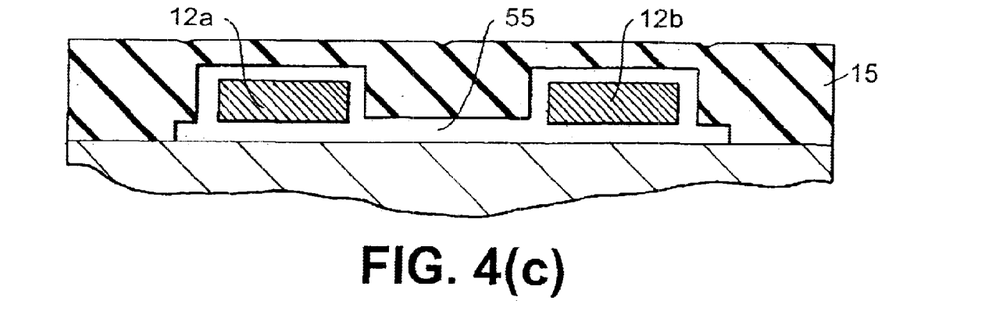

Finally, in an oxide deposition process, the vias 59a,b,c are filled with insulator and the structure is planarized to result in a gap-conducting structure having a gap 55 completely surrounding portion of conductors 12a,b as shown in FIG. 4(c).

Figure 5:
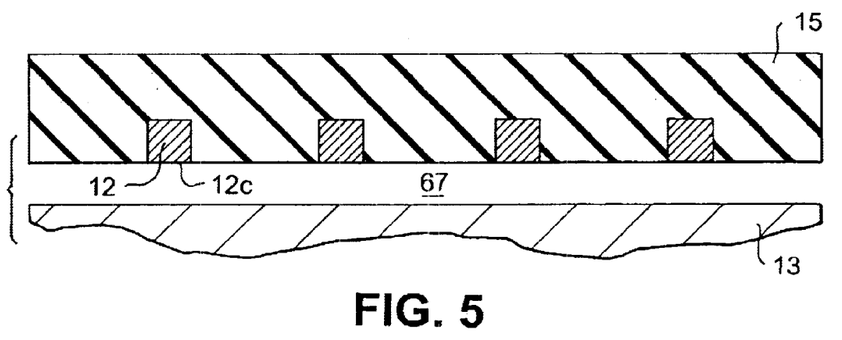
FIGS. 5–6 depict cross sectional views of a fuse including several conductors partially or completely exposed to a local thermal barrier (air gap) provided in an insulating portion.
Figure 6:
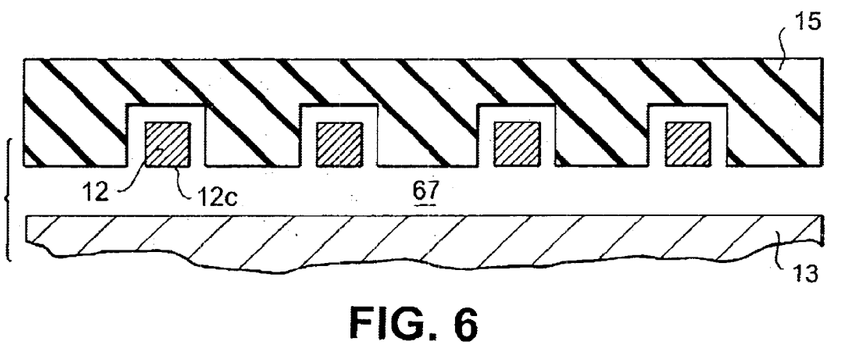
Figure 7:
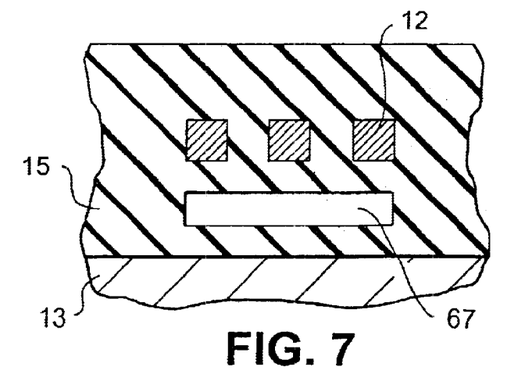
FIG. 7 depicts a cross sectional view of a fuse comprising several conductors and an insulator having a cavity disposed therein for interrupting thermal flow to cause a conductor to rapidly heat and become discontinuous.

The examples shown in FIGS. 1(c), 2(c), 3(c) and 4(c) are conceptually illustrated in FIGS. 5 and 6 to show interlevel conductor(s) 12 having a portion of the insulating layer 15 removed between at least one face 12c of each conductor and the silicon substrate 13 (FIGS. 5, 6) to create a thermal barrier 67. However, it should be understood that it is not necessary for the thermal barrier 67 to contact the conductor 12 or the substrate 13. FIG. 7 illustrates a cavity 67' provided wholly within an insulator 15 which interrupts thermal flow and causes a conductor 12 to heat and become discontinuous, as was experimentally demonstrated using aluminum lines of 0.4×0.4 μm cross sections, with approximately 35 ma of current, and a voltage drop of less than 0.7 volt.

It should be understood that the process of the invention described herein may be used on any level of wiring, and allows for both an underfill and overfill removal. The dimensions of the gap is a design choice dictated by the circuit application. For instance, when functioning as a fuse, the gap dimensions are dictated by the shape of the conducting line, and the amount of current the conductor is intended to carry. Generally, the thickness of the gap regions is of no concern. More particularly, the design of the fuse is based on the principles described in the following reference: H. A. Schafft, "Thermal Analysis of Electromigration Test Structures", IEEE Transactions on Electron Devices, Vol. ED-34, No. Mar. 3, 1987, the contents and disclosure of which is incorporated by reference as if fully set forth herein. The reference shows that the temperature of a doped polysilicon, silicided polysilicon line, or a metal line is given by equation (1) as follows:

$$T = T_{ambient} + \frac{(J^2) \cdot}{((K_{therm\ cond} \cdot \text{Ratio of dimensions})(J^2) \cdot))} \quad (1)$$

where
 ·=resistivity of the metal in ·–cm;
 J=current density in the metal in Amperes/cm²;
 $K_{thermal\ coefficient}$=thermal conductivity of the insulator in Watts/cm·K; and,
 B=temperature coefficient of resistivity.

As metal lines, doped polysilicon and silicided polysilicon in semi-conductor structures are thermally coupled to a silicon wafer by an insulator, and, as a silicon substrate itself is an excellent heat conductor and conducts sufficiently well to prevent the metal (or other conductors) from heating, reliability problems associated with current densities are minimized and the integrity of the lines is maintained.

If, according to the invention, segments of metal conductors are decoupled from the insulating material in order to make the $K_{thermal\ coefficient}$ coefficient of the insulator very small, the conductors may heat up. That is, the thermal coefficient in equation (1) may be controlled by design. The denominator of equation (1) comprises a thermal conduction portion minus a heating portion. If the thermal coefficient of conduction is reduced, then for that portion of the line segment, it is possible to produce heating in the metal conductor with a small current, and cause rapid heating and evaporation of a line, e.g., polysilicon or metal, such as tungsten, aluminum, copper, etc. In fact, the current necessary to provide fusing may be adjusted by the structure. If desired, in an alternate embodiment, both the underfill and overfill gap regions may comprise a dielectric material of low-level thermal conductivity. Additionally, a small layer of insulating material may separate a conductive layer from an air gap region, i.e, the gap does not have to touch the metal or reach it, but, rather may be below the metal with some insulative separation.

Furthermore, according to the teachings of commonly-owned, issued U.S. Pat. Nos. 6,141,245, and 6,219,215, the whole contents and disclosure of each of which is incorporated by reference as if fully set forth herein, an alternate gap underfill/overfill material, e.g., paralene, may be provided which is dissolvable by using an evaporative technique.

Figure 9:
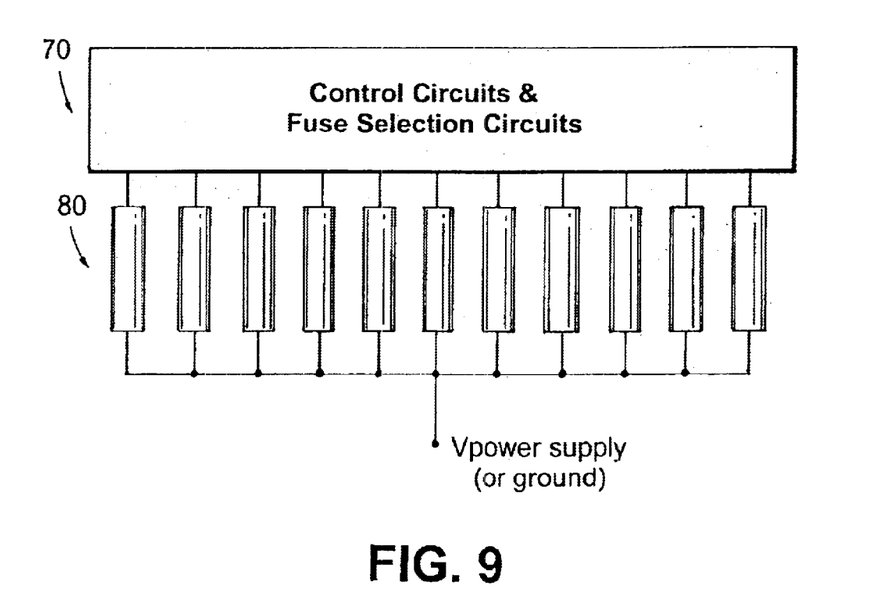
FIG. 9 is a circuit diagram illustrating the use of a bank of electronic fuse devices of the invention connected to a fuse blow and selection control circuits.

As shown in FIG. 9, multiple fuse structures such as shown in FIGS. 5 and 6, may be formed as part of a fuse bank 80 containing several fuse devices connected on one side to ground or, a voltage connection, and, on an opposite side to fuse blow and control circuits 70. With suitable logic, one or more fuses may be blown to tailor the amount of current required for example, to protect a particular circuit element, or provide a particular circuit function.

Figure 10:
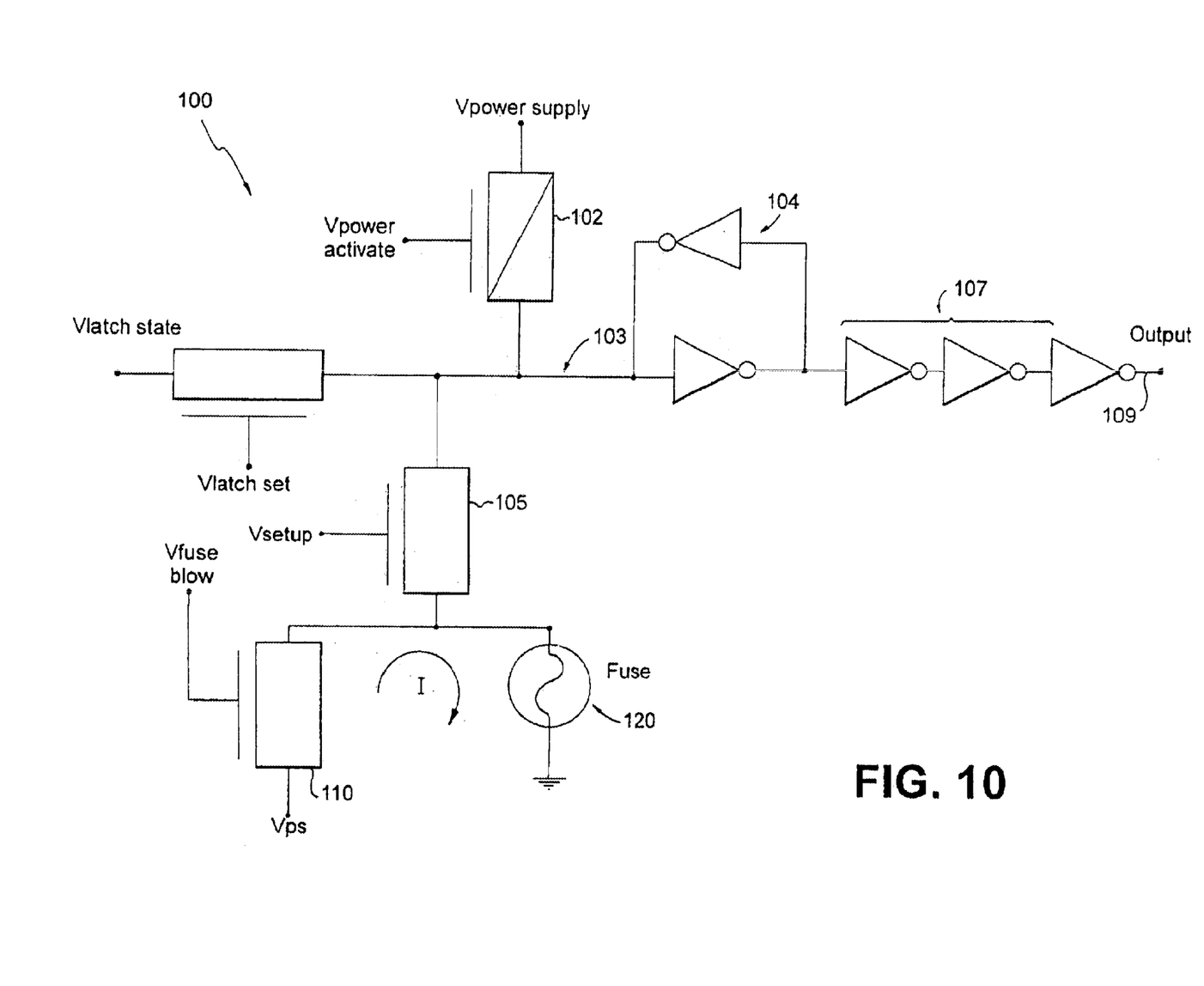
FIG. 10 is a diagram depicting a simple circuit for blowing an electronic fuse device of the invention and with a latch indicating the state of the fuse.

FIG. 10 depicts one circuit implementation 100 for blowing an electronic fuse device of the invention and, which may be operated to provide an indication of a state of a fuse device in an integrated circuit. As shown in FIG. 10, the fuse blow circuit is included as part of a power supply latch circuit 100 that, in operation, utilizes a first power activation transistor 102 for charging up a latch node 103 at the input of latch device 104. Thus, in operation, when power is turned on, a $V_{poweractivate}$ signal is activated to flip the Vpower supply latch and provide a logic "1" for instance, at the output 109 through a series of buffers 107. This, of course, assumes that a $V_{setup}$ transistor 105 is inactive (non-conducting). It should be understood that a complementary latch output signal (not shown) of opposite polarity may tapped off the output of one of the serial buffers 107. Subsequent, to power circuit activation, a check is made to determine the state of the fuse device 120 of the invention. Thus, the circuit 100 additionally includes a $V_{setup}$ transistor 105 which is fired after the $V_{poweractivate}$ signal is activated. That is, when $V_{setup}$ is fired, the transistor 105 becomes conducting. If the fuse device 120 has not been blown, i.e., is intact, then there is a path created to ground from the latch node 103 through setup transistor 105, which causes generation of a signal of opposite polarity, e.g., a logic "0", at the output 109 through a series of buffers 107. This output indicates that the fuse 50 is intact. If the fuse has been blown, however, in the manner described herein, the path to ground via fuse device 50 is open, and the output voltage signal remains at its activated state, e.g., logic "1," indicating that the fuse has been blown.

The portion of the circuit 100 for blowing a fuse device 120 includes a transistor device 110 having a $V_{fuse\ blow}$ input at its gate for activating fuse blow, a source (or drain) terminal connected to a power supply $V_{ps}$ and, the corresponding drain (or source) terminal connected to ground through the fuse device 120. In operation, as long as $V_{setup}$ transistor 105 is inactive (off), a $V_{fuse\ blow}$ voltage applied to gate of transistor 110 will enable current I to blow the fuse device 120.

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims.

Having thus described our invention, what we claim as new, and desire to secure the Letters Patent is:

1. An electronic fuse structure for an integrated circuit device including a semiconductor substrate, a dielectric layer formed atop said substrate, selected from the group consisting of $SIO_2$, NO, ONO, $Al_2O_3$, or oxides of TA, and having at least one conductive interconnect level including a conducting layer embedded in said dielectric layer, said conducting layer having a length and width dimension, said fuse structure comprising: a fuse portion of the embedded conducting layer; said fuse portion being determined by a cavity wholly formed and encapsulated within said dielectric layer between said substrate and said fuse portion of the embedded conducting layer; said cavity having a width dimension between one to three times greater than the width of said embedded conducting layer at said fuse portion and a length less than the length of the embedded conducting layer to enable destruction of said fuse portion, said cavity width and length dimensions determined by a shape of said conducting layer and by a temperature required to destruct said fuse portion at a desired fusing current.

2. The electronic fuse structure as claimed in claim 1, wherein said cavity is formed within said dielectric in a manner so as to partially expose said filament portion.

3. The electronic fuse structure as claimed in claim 1, wherein said cavity is formed within said dielectric in a manner so as to completely expose said filament portion.

4. An electronic fuse structure for an integrated circuit device including a semiconductor substrate, a dielectric layer formed atop said substrate, selected from the group consisting of $SIO_2$, NO, ONO, $Al_2O_3$, or oxides of TA, and having at least one conductive interconnect level including a conducting layer embedded in said dielectric layer, said conducting layer having a length and width dimension, said fuse structure comprising: a fuse portion of the embedded conducting layer; said fuse portion being determined by a cavity wholly formed and encapsulated within said dielectric layer between said substrate and said fuse portion of the embedded conducting layer; said cavity having a width dimension between one to three times greater than the width of said embedded conducting layer at said fuse portion and a length less than the length of the embedded conducting layer to enable destruction of said fuse portion, said cavity width and length dimensions determined by a shape of said conductor and by a temperature required to destruct said fuse portion at a desired fusing current at low current levels.

5. The fuse bank structure according to claim 4, wherein said cavity is formed within said dielectric in a manner so as to partially expose a portion of said conductor.

6. The fuse bank structure according to claim 4, wherein said cavity is formed within said dielectric in a manner so as to completely expose portions of said conductor.

7. The fuse bank structure according to claim 4, wherein each fuse device of said fuse bank includes a first connection to a respective means for blowing a selected fuse device in said bank, and a second connection to a ground or power source.

8. The fuse bank structure according to claim 7, wherein said means for blowing a selected fuse device in said bank includes a transistor device having a first terminal connected to a power supply voltage source and a second terminal connected to said first fuse connection, said transistor being activated by a low voltage signal to enable destruction of said fuse.

* * * * *